United States Patent
Jenkins et al.

(10) Patent No.: US 8,823,569 B2
(45) Date of Patent: Sep. 2, 2014

(54) DIGITAL-TO-ANALOG CONVERTER

(71) Applicants: Julian Jenkins, Kurraba Point (AU); Torsten Lehmann, Earlwood (AU)

(72) Inventors: Julian Jenkins, Kurraba Point (AU); Torsten Lehmann, Earlwood (AU)

(*) Notice: Subject to any disclaimer, the term of this patent is extended or adjusted under 35 U.S.C. 154(b) by 0 days.

(21) Appl. No.: 14/106,512

(22) Filed: Dec. 13, 2013

(65) Prior Publication Data
US 2014/0167994 A1    Jun. 19, 2014

(30) Foreign Application Priority Data
Dec. 18, 2012    (AU) .............................. 2012905535

(51) Int. Cl.
*H03M 1/66*    (2006.01)
*H03M 3/00*    (2006.01)
*H03M 1/06*    (2006.01)
*H03M 1/74*    (2006.01)
*H03M 1/00*    (2006.01)
*H03M 1/78*    (2006.01)

(52) U.S. Cl.
CPC ............ *H03M 3/502* (2013.01); *H03M 1/0641* (2013.01); *H03M 1/747* (2013.01); *H03M 1/00* (2013.01); *H03M 1/785* (2013.01)
USPC ........................................... 341/144; 341/145

(58) Field of Classification Search
CPC ..... H03M 1/747; H03M 1/00; H03M 1/0641; H03M 1/785
USPC .......................... 341/144, 145, 136, 131, 154
See application file for complete search history.

(56) References Cited

U.S. PATENT DOCUMENTS 7,501,969 B2 *    3/2009    Schoner ........................ 341/144

* cited by examiner

*Primary Examiner* — Joseph Lauture

(57) ABSTRACT

An apparatus and method for digital-to-analog conversion. A digital-to-analog converter includes a sampler for resampling a digital signal and a DAC array. The DAC array includes a sequencer, a unit element activator, and an array of one-bit DACs (unit elements). The unit elements are activated in a cyclical sequence, based on the resampled digital signal. Unit elements in the sequence may be skipped, based on a disruption probability. The disruption probability may be determined randomly, or pseudo-randomly. Output signals of the unit elements are summed or averaged to form an analog signal. The converter may include a filter to filter the analog signal.

20 Claims, 9 Drawing Sheets

DIGITAL-TO-ANALOG CONVERTER

CROSS REFERENCES TO RELATED APPLICATIONS

This application claims priority from Australian Provisional Patent Application Serial No 2012905535, entitled An apparatus and method of digital-to-analogue conversion, filed on Dec. 18, 2012, which is hereby incorporated by reference herein for all purposes.

BACKGROUND

The present invention relates to digital-to-analog conversion and particularly to an apparatus and a method for digital-to-analog conversion using an array of unit elements. A digital-to-analog converter is commonly referred to as "DAC" in the art.

In digital-to-analogue conversion, the originating digital signals often have a high resolution, for example, at 16 bits. Due to their high number of quantized levels, high-resolution digital signals often require complex electronics and components for suitable conversion to an analog signal. Techniques exist to allow conversion of high-resolution digital signals to analog signals using low-resolution components. However, those may lead to distortions such as quantization noise in the analog signals.

Furthermore, as semiconductor line width decreases, it is difficult to achieve a highly linear current source and thus to construct current-source-based digital-to-analog converters with good linear characteristics. There is an unmet need for digital-to-analog converters with highly linear characteristics and low quantization noise.

SUMMARY

According to a first aspect of the present invention there is provided a digital-to-analog converter, comprising a sampler for resampling a digital signal which is quantized at a first resolution and synchronized at a first sampling rate to provide a resampled digital signal which is quantized at a second resolution lower than the first resolution and synchronized at a second sampling rate higher than the first sampling rate, and a DAC array for converting the resampled digital signal to an analog signal, the DAC array including an array of unit elements that are configured to (i) be activated in accordance with a cyclical sequence which is disrupted probabilistically; and (ii) upon activation contribute substantially equally to the analog signal.

The DAC array may comprise a unit element activator for activating one or more unit elements of the array of unit elements for each sample of the resampled digital signal as received from the sampler, wherein an activation is based on the value of the respective sample. The DAC array may include a sequencer which is operatively coupled with the unit element activator, and configured to determine the probabilistically disrupted cyclical sequence based on a disruption probability. The sequencer may further include a decider module for deciding for each sample of the resampled digital signal whether or not to disrupt the cyclical sequence based on the disruption probability.

The sequencer may determine, for each sample of the resampled digital signal, which unit elements of the array will be activated based on a cyclical algorithm, and wherein, upon deciding to disrupt the cyclical sequence for a sample of the resampled digital signal, the sequencer is configured to bypass at least one unit element in the cyclical sequence.

According to a second aspect of the present invention there is provided a method for converting a digital signal to an analog signal, comprising receiving the digital signal quantized at a first resolution and synchronized at a first sampling rate; resampling the received digital signal to provide a resampled digital signal quantized at a second resolution lower than the first resolution and synchronized at a second sampling rate higher than the first sampling rate; deciding, randomly or pseudo-randomly, if for the resampled digital signal a cyclical sequence is to be continued or disrupted; in response to a decision to continue the cyclical sequence, activating a first one-bit DAC unit element that is cyclically adjacent to a previously activated second one-bit DAC unit element; in response to a decision to disrupt the cyclical sequence, skipping a first one-bit DAC unit element that is cyclically adjacent to a previously activated second one-bit DAC unit element, and activating a third one-bit DAC unit element; and summing or averaging output signals of activated one-bit DAC unit elements, to contribute substantially equally to the analog signal.

The method may further comprise filtering the analog signal.

As used herein, except where the context requires otherwise, the term "comprise" and variations of the term, such as "comprising", "comprises" and "comprised", are not intended to exclude further additives, components, integers or steps.

Further aspects of the present invention and further embodiments of the aspects described in the preceding paragraphs will become apparent from the following description, given by way of example and with reference to the accompanying drawings.

BRIEF DESCRIPTION OF THE DRAWINGS

The invention will be described with reference to the drawings, in which.

DETAILED DESCRIPTION OF EMBODIMENTS

The present invention relates to an apparatus and a corresponding method for converting a digital signal to an analog signal. The apparatus and the method may be suited for digital-to-analog conversion of high-resolution digital signals using low-resolution components. As will be described in more detail below, the digital-to-analog conversion in accordance with the present invention involves pre-conversion digital signal processing and, optionally, post-conversion analog signal processing (which may be inherent or intentional) to improve noise performance of the resulting converted analog signal.

Figure 1A:
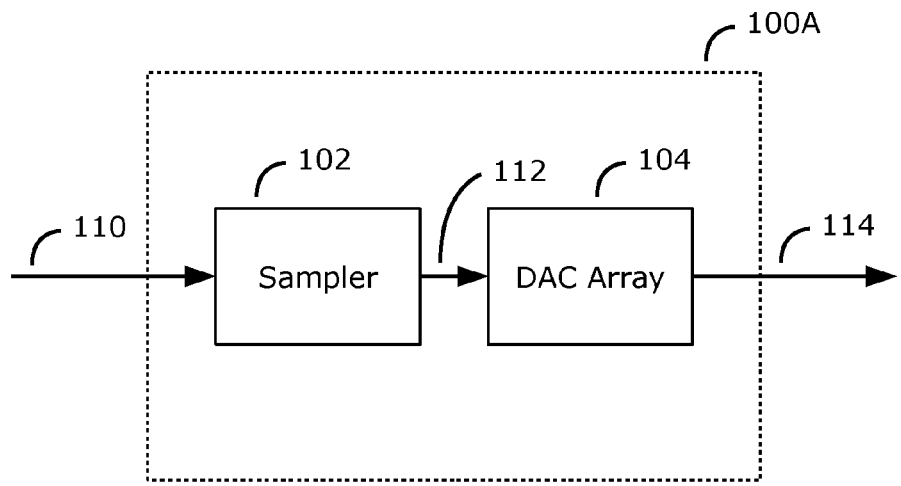
FIG. 1A-B illustrate two embodiments of a DAC in accordance with the present invention.

FIG. 1A illustrates an embodiment of an apparatus for digital-to-analog conversion (a "DAC") in accordance with the present invention. In this embodiment, the apparatus 100A comprises a sampler 102 for resampling a digital signal 110 to provide a resampled digital signal 112, and a DAC array 104 for converting the resampled digital signal 112 to an analog signal 114. In some embodiments such as the one illustrated in FIG. 1B, the apparatus 100B may further comprise an optional filter 106 for filtering the analog signal 114 to produce a filtered analog signal 116.

The digital signal 110 may be received as an input signal at the apparatus 100A or 100B.

The sampler 102 may include one or more sigma-delta modulators for resampling the input signal 110. Prior to resampling, the input signal 110 is quantized at a first resolution and synchronized at a first sampling rate. After resampling, the resampled signal 112 is quantized at a second resolution lower than the first resolution and synchronized at a second sampling rate higher than the first sampling rate. For example, the input signal 110 may be a 16-bit signal at a sampling rate of 31.25-MHz. The sampler 102 may be configured to resample the input digital signal 110 to provide a resampled digital signal 112 quantized with a 3-bit resolution at a sampling rate of 2-GHz (i.e. 64 times oversampling).

By oversampling, i.e. resampling at a higher sampling rate, and lowering the signal resolution, quantization noise due to a quantization error may be introduced into the resampled signal 112 at frequencies higher than the Nyquist frequency of the input (which represents the useful bandwidth of the input and is equal to half of the first sampling rate). Since the original digital signal 110 does not contain any frequency components higher than the input Nyquist frequency, low-pass or band-pass filtering may reduce the quantization noise by reducing any high-frequency components present in the analog signal from the DAC array 104. In the embodiment illustrated in FIG. 1B, filtering may be implemented via a dedicated filter 106, which may be a low-pass filter (allowing low-frequency components to pass while suppressing high-frequency components) or a band-pass filter (allowing frequency components within a specific frequency band to pass while suppressing other frequency components). In some embodiments such as that illustrated in FIG. 1A, the filter 106 is not necessary because quantization noise at high frequencies may be attenuated due to the intrinsic bandwidth of the various internal components of the apparatus 100A or an apparatus receiving the signal 114. In this case, the various internal components with their respective bandwidth together may be regarded as forming a "distributed" filter, obviating the need for a dedicated filter 106 as in the apparatus 100B.

The present invention also provides a corresponding method of converting a digital signal to an analog signal. In its most general form, the method comprises the steps of (a) receiving a digital signal quantized at a first resolution and synchronized at a first sampling rate, (b) resampling the received digital signal to provide a resampled digital signal quantized at a second resolution lower than the first resolution and synchronized at a second sampling rate higher than the first sampling rate, and (c) converting the resampled digital signal to an analog signal via a DAC array that includes an array of unit elements arranged in a cyclical sequence and configured to: (i) be activated in accordance with the cyclical sequence and a probabilistic disruption to the sequence and (ii) upon activation contribute substantially equally to the analog signal. In some embodiments, the method further comprises an optional step of filtering the analog signal by a filter, such as a low-pass or band-pass filter, to produce a filtered analog signal. As mentioned above, the intrinsic bandwidth of the apparatus 100A may obviate the need for the filter 106.

Figure 2:
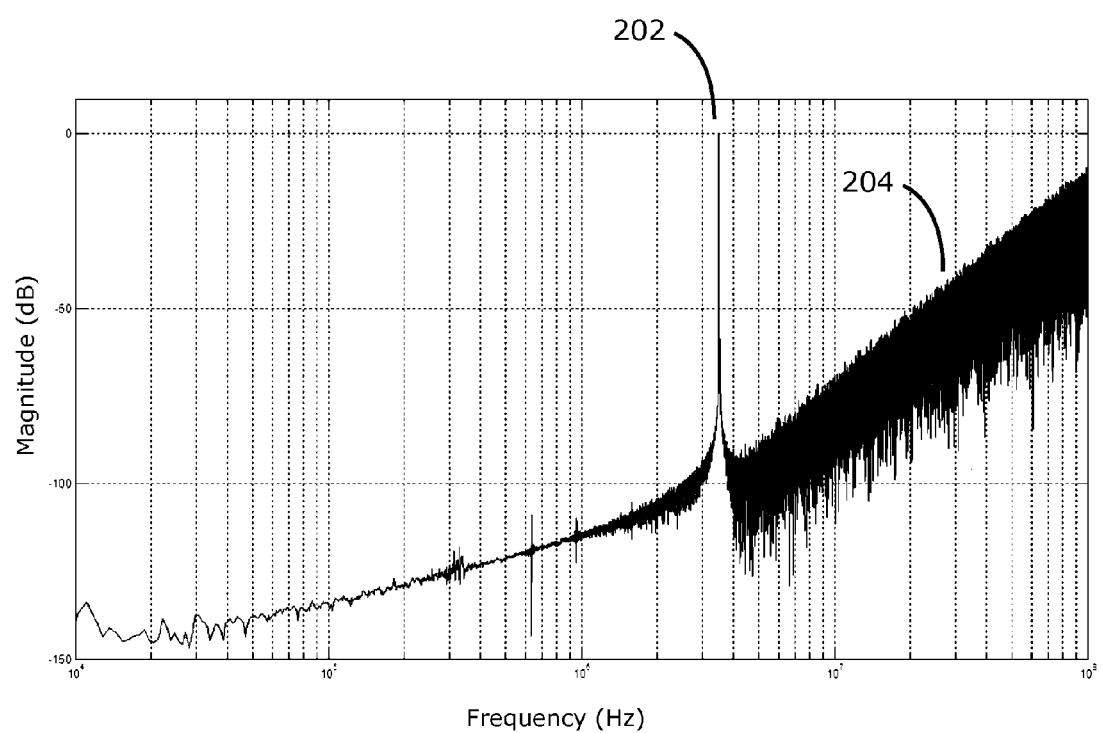
FIG. 2 illustrates a calculated example of a spectrum of an analog output from the embodiment of the apparatus illustrated in FIG. 1A.

FIG. 2 illustrates an example plot of a calculated spectrum of the analog signal output 114 of the DAC 104 prior to filtering by the filter 106. In this example, the DAC array 104 is a 3-bit DAC and the sampler 102 is a third-order sigma delta modulator. The plot depicts the spectral intensity of a sinusoidal signal 114 in a logarithmic scale (dB) against frequency in a logarithmic scale (Hz) up to 100 MHz. A spike 202 centered at approximately 3.5 MHz represents the desired frequency components of the signal 114. Since in general quantization noise increases at 20 dB/decade per order of the sigma delta modulator, it can be seen in FIG. 2 that quantization noise 204 increases in spectral intensity at 60 dB/decade. The quantization noise 204 may be attenuated (not shown) by the filter 106 in the apparatus 100B or the intrinsic bandwidth of the apparatus 100A or an apparatus receiving the signal 114. For example, a suitable filter 106 may be a third-order low-pass filter with its pole near 50 MHz while preserving the desired frequency components of signal 114. Alternatively, a suitable filter 106 may be a band-pass filter configured to allow at least the signal 114 including most of its signal bandwidth to pass while rejecting frequency components outside the signal bandwidth. With a suitable low-pass or bandpass filter 106, the filtered signal 116 in the frequency domain ideally resembles what is depicted in FIG. 2 but with the quantization noise 204 removed.

Figure 1B:
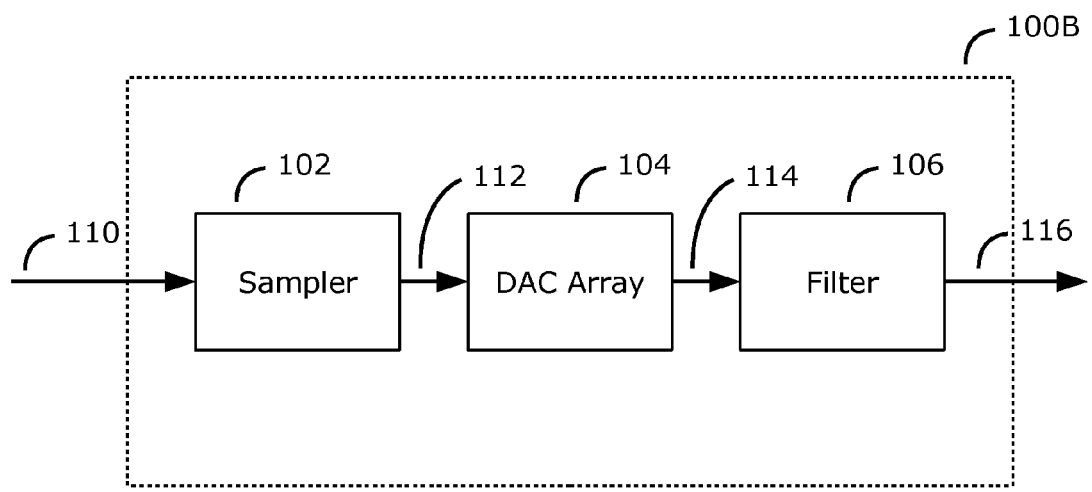
Figure 3:
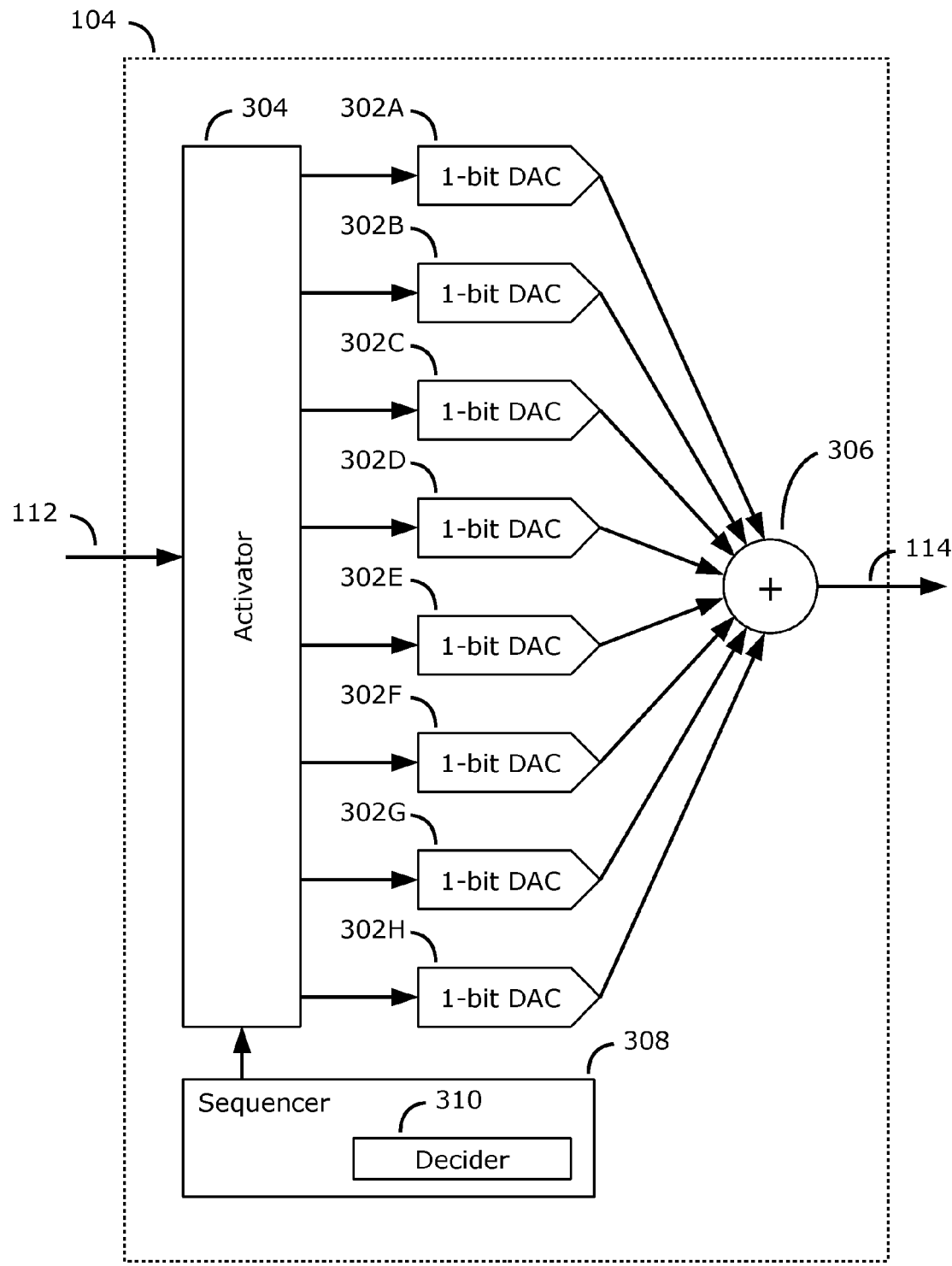
FIG. 3 illustrates an example of a DAC array suitable for use in the embodiment of an apparatus illustrated in FIG. 1A.

Referring to FIG. 3, the DAC array 104 of FIG. 1A-B may include an array 302 of unit elements 302A to 302H, a unit element activator 304 and a summation element 306. The unit elements 302A to 302H each represent one quantized level of the resampled digital signal 112. In FIG. 3, each unit element includes a 1-bit DAC. The unit element activator 304 may be configured to receive the resampled signal 112 and activate the unit elements 302 individually based on the resampled signal 112. The summation element 306, which in some embodiments may simply be a semiconductor junction electrically coupled to each of the outputs of the 1-bit DACs, is configured to sum or average the contributions, such as a voltage or a current, of all activated unit elements to produce the analog signal 114. Therefore, the unit elements 302A to 302H upon activation are configured to contribute substantially equally to the analog signal. The contribution from each element is substantially equal but may not be exactly equal due to imperfections of the array 302 of unit elements 302A to 302H such as electrical property mismatch among the array of unit elements 302A to 302H. The electrical property mismatch may be associated with non-identical properties of the array of unit elements such as mismatch in input/output linearity or resistance among the unit elements. An effect of such imperfections is that the analog signal 114 may suffer from nonlinearity.

The number of unit elements 302A to 302H included in the DAC array 104 may depend on the resolution of the resampled signal 112. For example, if the resampled signal 112 has a 3-bit resolution, it has 8 corresponding quantized levels (such as 0, 1, 2, 3, 4, 5, 6 and 7 in an unsigned binary integer representation). Accordingly, the DAC 104 may include a minimum of 7 unit elements, each of which upon activation contributes a quantized level to produce the analog signal ranging, for example, from 0-V to 875-mV in increments of 125-mV, or from 0-mA to 7-mA in increments of 1-mA. In general, the number of unit elements included in the DAC array 104 is at least the number of quantized levels of the resampled digital signal minus one. There may be more elements than this minimum number of unit elements. In the examples above, the DAC 104 includes 8 unit elements, but a 3-bit signal may only cause simultaneous activation of a maximum of 7 unit elements per sample.

For each sample of the resampled signal 112, the unit element activator 304 may determine the number of unit elements to be activated based on the value of the respective sample contained in the resampled signal 112. For example, if a sample of the resampled signal 112 is "101" in an unsigned binary integer format, the digital signal may represent an analog value of 5. The DAC array 104 upon receiving this particular 3-bit signal sample "101" may cause the unit element activator 304 to activate 5 of the 8 elements, the contribution of which may be summed by the summation element 306 to produce a corresponding analog signal of, for example, 625-mV or 5-mA. It is noted that the actual binary presentation used in this example is merely for illustrative purposes, and that other binary presentations may be used to determine the number unit elements to be activated. Similarly, the voltage and current levels are merely for illustrative purposes, and other values may be used in practical embodiments.

As mentioned above, imperfections such as non-identical properties of the array of unit elements may lead to non-ideal characteristics of the DAC array 104 output and hence non-ideal characteristics of the analog signal 114. The present invention provides pre-conversion digital signal processing for reducing the impact of such imperfections.

In one embodiment, the array of unit elements 302A to 302H are configured to be activated in accordance with a cyclical sequence which is disrupted probabilistically. Referring back to FIG. 3, the DAC array 104 may include a sequencer 308 for determining the cyclical and probabilistically disrupted sequence based on a disruption probability p where $0 < p < 1$.

In general, and as described in more detail below, the cyclical sequence represents the non-disrupted order in which the unit elements 302A to 302H are selected for activation. The sequence is cyclical in the sense that once all elements 302A to 302H have been selected for activation in a particular sequence, the next unit element(s) arranged for activation cycle(s) back to the first one or more unit elements, i.e. 302A.

In this embodiment, the sequencer 308 may include a decider module 310 for deciding for each sample of the resampled digital signal whether or not to disrupt the cyclical sequence based on the disruption probability p. For example, a random or pseudo-random number generator may be used to generate a random number z between 0 and 1 inclusive. If $z < p$, then the decider module 310 may decide to disrupt the cyclical sequence. Alternatively, if $z \geq p$, then the decider module 310 may decide not to disrupt the cyclical sequence. For example, if p=0.1, then there is a 10% chance (or on average 1 out of 10 samples) for the decider module 310 to decide to disrupt the cyclical sequence. Disruption to the cyclical sequence may take one of several forms. For example, the sequencer 308, upon deciding to disrupt the cyclical sequence for a sample, may bypass one or more unit elements 302A to 302H. That is, one or more unit elements 302A to 302H may be bypassed for activation. In case of a cyclical sequence, the bypassed unit elements 302A to 302H may be one or more unit elements arranged for next activation in accordance with the cyclical sequence. In one embodiment, the number of elements to bypass (that is, if it is decided to disrupt the cyclical sequence) may be random. For example, the random or pseudo-random number generator may be additionally used to generate a number q between 0 and 1 inclusive, based on which a random number of elements r (e.g. r=ceiling(10 q) where "ceiling( )" represents the ceiling function) may be bypassed.

The disruption probability is generally greater than 0 and less than 1 so that it is not certain whether disruption is to occur. The cyclical sequence with the probabilistic disruption is provided to the unit element activator 304 for activating the appropriate unit elements 302A to 302H.

Even without the probabilistic disruption, the cyclical approach has the benefit of minimizing the non-ideal characteristics of the unit elements 302A to 302H by relying on all unit elements 302A to 302H substantially equally instead of relying on the same unit elements 302A to 302H to produce the same analog values. For example, referring to FIG. 3, instead of activating unit element 302A every time a "001" signal is received by the unit element activator 304 (which would repeatedly manifest any non-ideal characteristic of unit element 302A), the DAC array 104 may seek to randomize the activation of any one of the 8 unit elements 302A to 302H to produce an analog value of 1. Over time, all unit elements 302A to 302H may be used substantially equally, such that on average the analog value produced for each quantized level ideally becomes an undistorted multiple of the average contribution of all unit elements. For example, an analog value of 5 which is produced is expected to be 5 times the average contribution of all 8 unit elements. However, the cyclical approach would produce another type of undesirable distortions to the analog signal that can be reduced by the probabilistic disruption as described further below.

Figure 4:
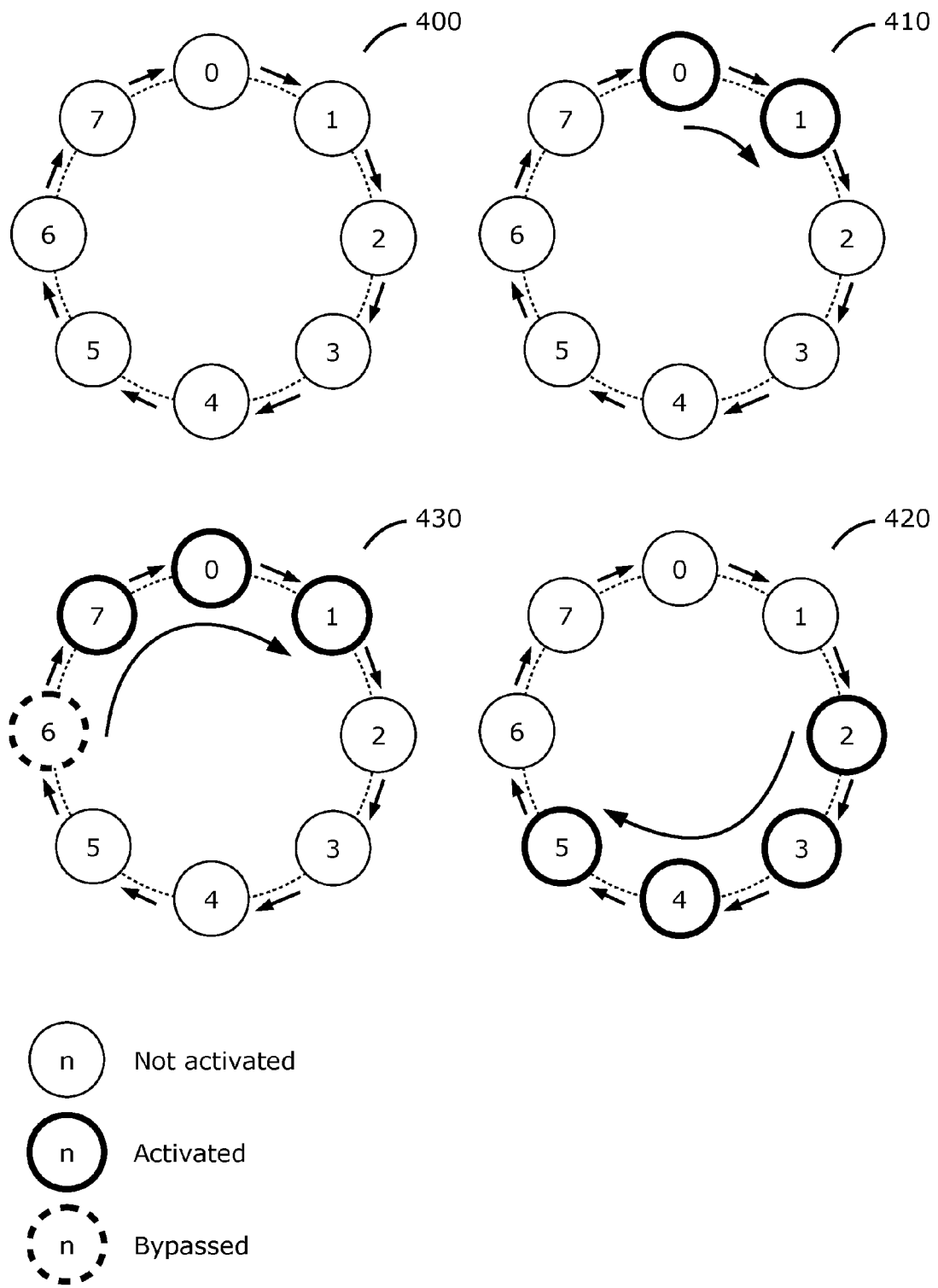
FIG. 4 illustrates a schematic of a probabilistic disruption to a cyclical sequence used in the example of a DAC array illustrated in FIG. 3.

FIG. 4 illustrates schematically an example of how the sequencer 308 may determine and select the unit elements 302 for activation. The unit elements 302 in a cyclical sequence 400 are labeled "0", "1", "2", . . . "7" for ease of reference and correspond to, respectively, unit elements 302A, 302B, . . . 302H. In this example, four consecutive samples 400, 410, 420 and 430 of the resampled signal 112 are received by the unit element activator 304. The four consecutive samples 400, 410, 420 and 430 and the corresponding activated unit elements are depicted in FIG. 4. An example of operation of the sequencer 308 is described as follows:

For sample 400, a 3-bit signal of "000" is received. No unit elements are determined for activation.

For sample 410, a 3-bit signal of "010" is received. The sequencer 308 determines that 2 unit elements are to be activated. The decider 310 decides, based on the disruption probability p which is generated by e.g. a random or pseudo-random number generator, that the cyclical sequence 400 is not to be disrupted. The sequencer 308 selects unit elements 302A and 302B for activation as the first two in the cyclical sequence 410 arranged for activation.

For sample 420, a 3-bit signal of "100" is received. The sequencer 308 determines that 4 unit elements are to be activated. The decider 310 decides, again based on the disruption probability p, that the cyclical sequence is not to be disrupted. The sequencer 308 selects unit elements 302C, 302D, 302E and 302F for activation as the next four in the cyclical sequence 420 arranged for activation.

For sample 430, a 3-bit signal of "011" is received. The sequencer 308 determines that 3 unit elements are to be activated. The decider 310 decides, based on the generated disruption probability p, that the cyclical sequence is to be disrupted. The sequencer 308 bypasses unit element 302G and selects unit elements 302H, 302A and 302B for activation as the next three in the cyclical sequence 430 arranged for activation. It is noted that once the sequence reaches unit element 302H, the sequence cycles back to unit element 302A, then unit element 302B and so on.

A general algorithm that may be used by the sequencer 308 to select one or more of n unit elements (i.e. unit elements 0, 1, 2 . . . (n−1)) for activation in cyclical and probabilistically disrupted sequence may be summarized as follows. Assuming an initial sample value representing a non-zero analog value $x_0$ is received:

1. Start from unit element m0
2. Activate the next x0 elements, which are:
   if $m_0+x_0-1<n$, unit element $m_0$ to unit element $m_0+x_0-1$; or
   if $m_0+x_0-1>n$, unit element $m_0$ to unit element n−1 and unit element 0 to unit element $m_0+x_0-n-1$.

For each subsequent sample representing a non-zero analog value $x_i$ selected from $\{x_1, x_2, x_3, \ldots\}$ received:

3. Calculate the next starting unit element $m_i$ to be:
   if sequence is not to be disrupted, unit element $(m_{i-1}+x_{i-1})$ mod n; or
   if sequence is to be disrupted, unit element $(m_{i-1}+x_{i-1}+r)$ mod n.

4. Activate the next $x_i$ elements, which are:
   if $m_i+x_i-1<n$, unit element $m_i$ to unit element $m_i+x_i-1$; or
   if $m_i+x_i-1>n$, unit element $m_i$ to unit element n−1 and unit element 0 to unit element $m_i+x_i-n-1$.

For completeness, if a zero analog value is received, then the sequencer 308 may be configured to determine that no elements are to be activated and none of steps 1 and 2 (if $x_0=0$) or steps 3 and 4 (if $x_i=0$) would be executed.

In the frequency domain, the probabilistic disruption may appear as an injected white noise signal. This white noise signal is injected to be mixed with spurious tones associated with or caused by electrical property mismatch between the unit elements.

Figure 5A:
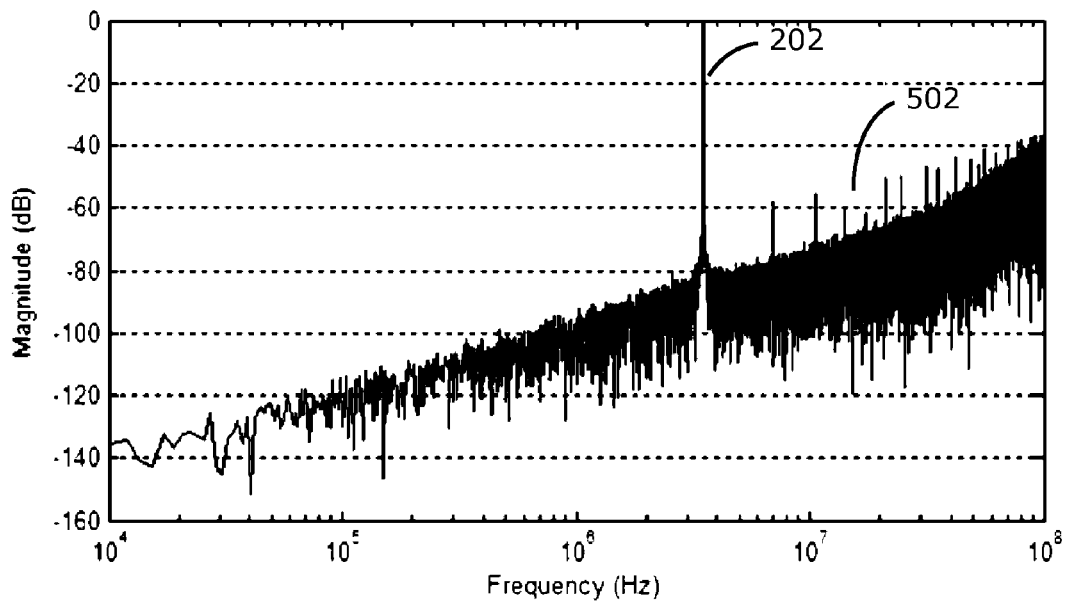
FIG. 5A-D illustrate calculated spectra of an analog signal produced in accordance with the probabilistic disruption illustrated in FIG. 4.

FIGS. 5A to 5D illustrate the effects of using various disruption probabilities p on a DAC with 7 unit elements, each of which contributes a value to the analog signal 114, where the values are samples taken from a large population normally distributed about the mean contribution of the 7 unit elements with a standard deviation equal to 20% of the mean contribution. FIG. 5A shows an example of a calculated spectrum of the analog signal 114 with no disruption to the cyclical sequence (i.e. p=0). One may observe spurious tones 502 associated with the unit element mismatch shown as distinct peaks between approximately 7-MHz and approximately 100-MHz in FIG. 5A. The origin of the spurious tones 502 may be understood as follows. For instance, using the 3-bit example above, if a constant signal "001" is received sequentially for each sample, then without any disruption to the cyclical sequence, each unit element will be activated one at a time per sample in the cyclical sequence. Due to imperfections such as non-equal contribution of the array of unit elements 302A to 302H, the analog signal output 114 fluctuates as a periodic signal since the same cycle of unit elements are repeatedly activated. This periodic signal therefore manifests itself as distinct peaks in the frequency domain.

Figure 5B:
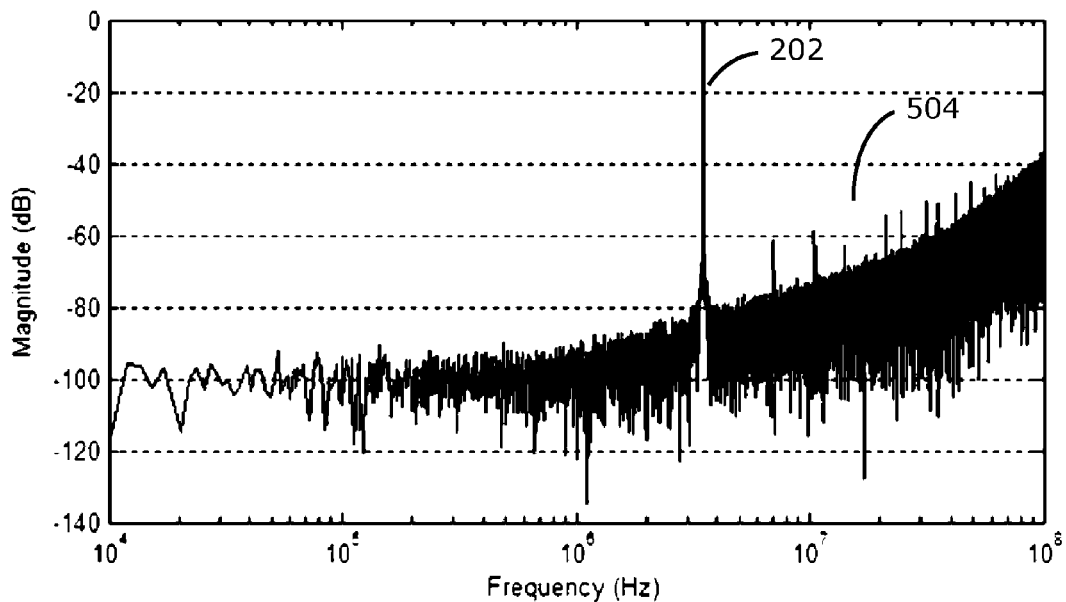
Figure 5C:
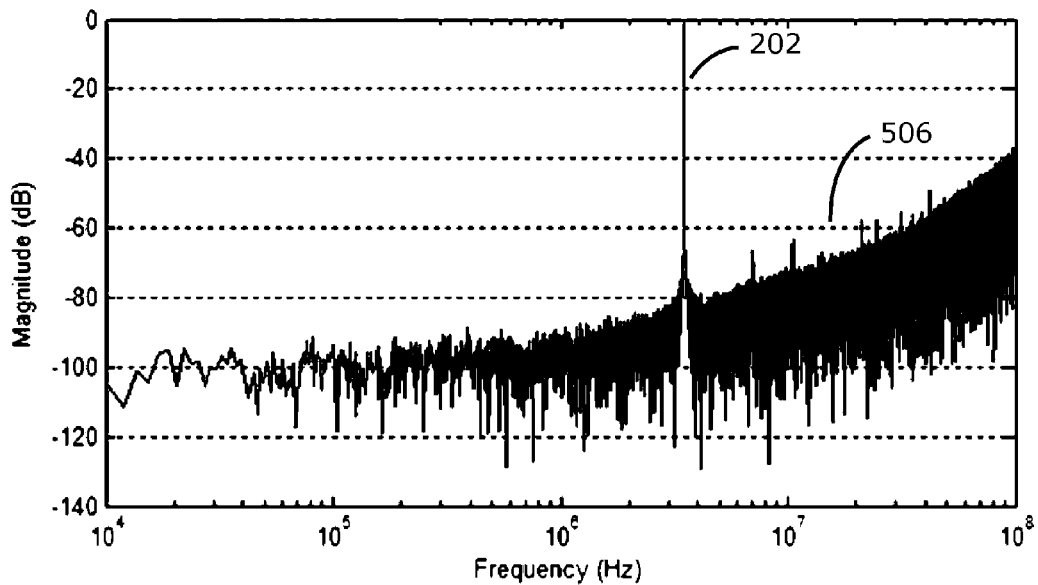
Figure 5D:
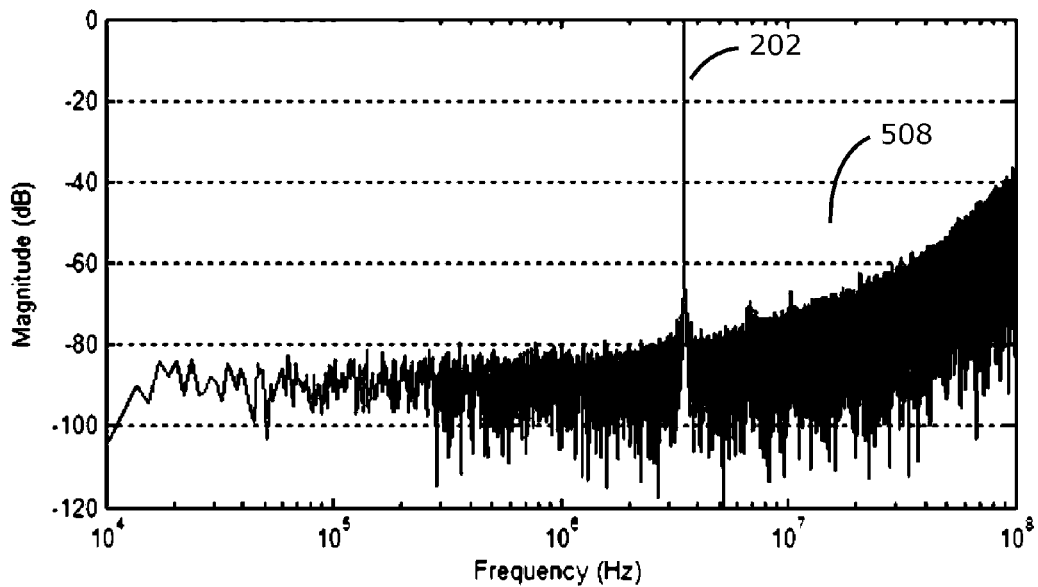

FIG. 5B shows an example of a calculated spectrum of the analog signal 114 with a low disruption probability (p=1/8192) in disrupting the cyclical sequence 400. Spurious tones 504 caused by the unit element mismatch shown in FIG. 5B are reduced in amplitude compared to those in FIG. 5A. FIG. 5C and 5D show further examples of calculated spectra of the analog signal 114 with, respectively, a higher (p=1/4096) and an even higher disruption probability (p=1/512) in disrupting the cyclical sequence 400. Spurious tones 506 and 508 caused by the unit element mismatch shown in FIGS. 5C and 5D are reduced even more in amplitude compared to those in FIG. 5B. The effect of an increasing disruption probability p is to lower the peak spectral power of the spurious tones by spreading the total spectral power over a wider frequency range (not observable in FIGS. 5B to 5D due to the limited resolution of the frequency axis) but increasing the noise floor. For example, the spectrum depicted in FIG. 5D illustrates that the spurious tones 508 caused by the unit element mismatch have been reduced to the point where they are almost indistinguishable from the noise floor. In some applications, it may be the peak noise level that is the most important parameter for measuring signal quality.

It should also be apparent that the spurious tones 502, 504, 506 and 508 have frequency components well above the frequency of the desired signal at 3.5-MHz. In these cases, it may be sufficient to reduce the spurious tones caused by unit element mismatch through low pass or band-pass filtering by the intrinsic bandwidth of the apparatus 100A or the dedicated low-pass or band-pass filter 106 in apparatus 100B, so that a lower disruption probability p may be used.

Figure 6:
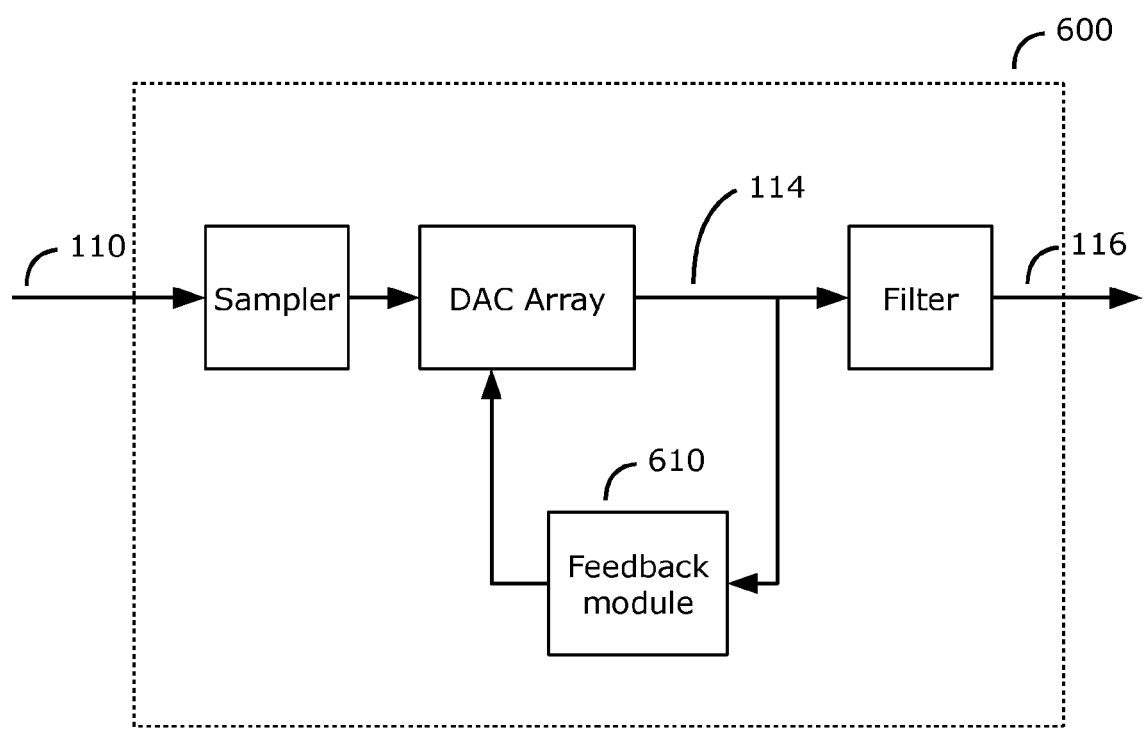
FIG. 6 illustrates another embodiment of a DAC in accordance with the present invention.

Referring to FIG. 6, in yet another embodiment of the invention, the apparatus 600 may further comprise a feedback module 610 for adjusting the disruption probability based on the analog signal 114 or the filtered analog signal 116. The feedback module 610 may be configured to adjust the disruption probability based on any reduction of the spurious tones present in the analog signal 114 or the filtered analog signal 116. For example, the feedback module 610 may be configured to increase p gradually until the peak power of the spurious tones is reduced close to or below the noise floor.

Figure 7:
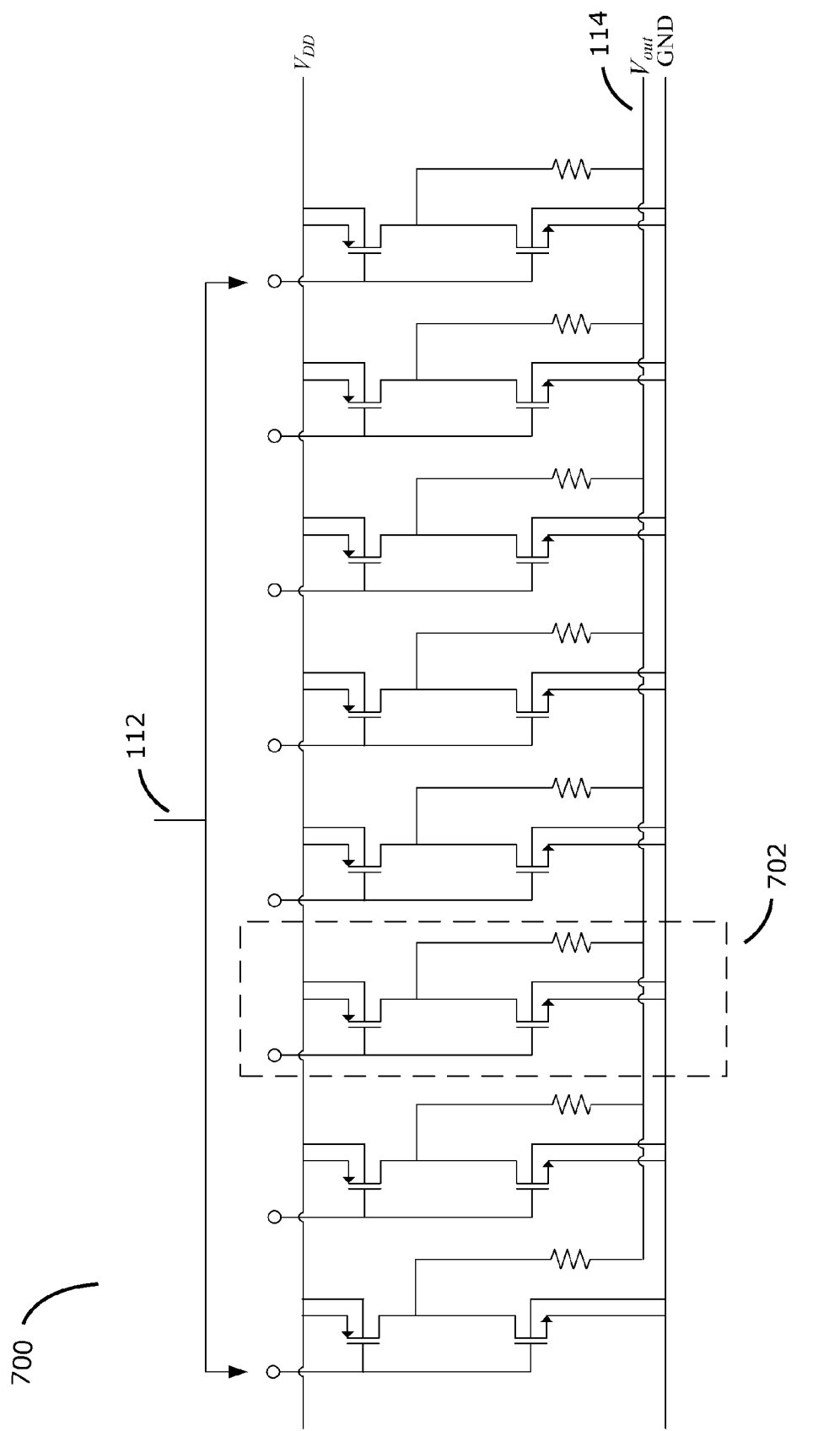
FIG. 7 illustrates another example of a DAC array suitable for use in the embodiments of an apparatus illustrated in FIGS. 1A-B and FIG. 6.
Figure 8:
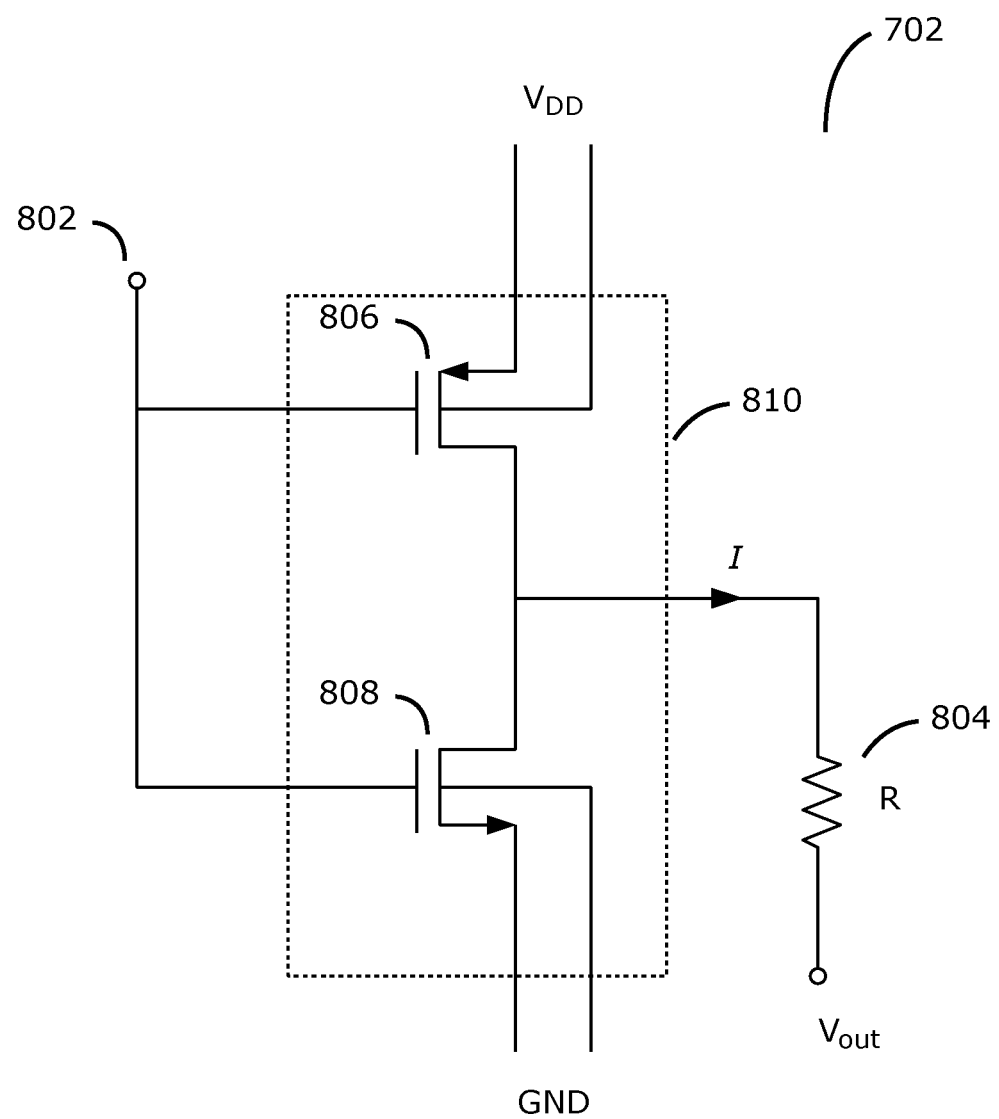
FIG. 8 illustrates a unit element used in the example of a DAC array illustrated in FIG. 7.

FIG. 7 depicts another example 700 of the DAC array (a possible embodiment for 104) for converting a resampled signal 112 to produce an analog signal 114. As illustrated in FIGS. 7 and 8, the DAC array 700 may include an array of unit elements 702 each including a voltage source, for example a push-pull stage 810, driving a resistive element 804. Each unit element 702 may have an input terminal 802 for receiving a logic signal (logic high or logic low) and an output terminal driving the resistive element 804.

The push-pull stage 810 may be switchable between two states. In one state, the push-pull stage 810 is configured to provide a first substantially constant voltage, whereas in the other state, the push-pull stage 810 is configured to provide a second substantially constant voltage. The push-pull stage 810 may include a pair of complementary transistors 806 and 808 in a push-pull configuration. The complementary transistors each include a gate terminal operatively coupled with the input terminal 802 and configured to be driven by a logic input signal representative of one quantized level per sample of the resampled signal 112.

The logic input signal may be derived from the resampled signal 112. In this example, resampled signal 112 is a 3-bit signal which may be first translated into 8 individual quantized levels. Alternatively the DAC array 700 may include the unit element activator 304 operatively coupled with sequencer 308 (as illustrated in FIG. 3) for driving or activating individual unit elements 702.

Referring to FIG. 8, the pair of complementary transistors includes an n-channel MOSFET (nMOSFET) 808 including a first drain terminal and a p-channel MOSFET (pMOSFET) 806 including a second drain terminal, the first drain terminal and the second drain terminal being coupled with each other and configured to drive the resistive element 804 of resistance R. All resistive elements are connected in parallel at a common output at voltage Vout.

Each push-pull stage 810 is configured to switch between two states based on the input signal commonly driving the gate terminals of the pair of complementary transistors 806 and 808. If the input signal is at logic high (V=$V_{DD}$), the nMOSFET 808 is on, the pMOSFET 708 is off, the push-pull stage 810 is switched to a first state providing an output voltage which is at ground, and the current $I_{low}$ flowing out of the push-pull stage 810 output is (assuming an on-resistance of the MOSFETs is small):

$$I_{low}=-(V_{out}-0)/R$$

On the other hand, if the input signal is at logic low (V=0), the nMOSFET 808 is off, the pMOSFET 806 is on, the push-pull stage 810 is switched to a second state providing an output voltage which is at $V_{DD}$ and the current $I_{high}$ flowing out of the push-pull stage output equals (assuming an on-resistance of the MOSFETs is small):

$$I_{high}=(V_{DD}-V_{out})/R$$

Also assuming there are m unit elements, of which b have a logic low applied to them whereas (m−b) have a logic high applied to them, and knowing that the sum of all currents at the common output of the resistive elements should be zero, we may write:

$$b\,I_{high}+(m-b)I_{low}=0$$

Substituting the formulas for $I_{high}$ and $I_{low}$ yields:

$$V_{out}=V_{DD}(b/m)$$

Therefore the output voltage $V_{out}$ is linear between b=0 and b=m.

As shown in FIG. 7, the unit elements 702 may form a thermometer encoded array in parallel. In this configuration, the output impedance of the DAC 600 equals the effective parallel resistance of the resistive elements (which are inherently linear regardless of the input signal to the DAC) each added to an on-resistance of the pair of complementary transistors (which may be nonlinear). If the resistance of each resistive element 804 is sufficiently larger than the on-resistance of the corresponding pair of complementary pair of transistors 806 and 808, the DAC array 700 has an output impedance substantially equal to the effective parallel resistance of the resistive elements. In the example illustrated in FIG. 7 in which there are eight unit elements, the effective resistance of the resistive elements is R/8. In other words, depending on the linearity requirements of the DAC array 700, the resistance of the resistor may be made sufficiently greater than the on-resistance of the transistors 806 and 808 to meet those requirements such that the nonlinear characteristic may be attenuated below the allowed deviation. For example, in an 180-nm semiconductor fabrication process, it is expected that linearity may be suitably achieved if the resistance of each of the resistors is approximately 20,000 times greater than the on-resistance of the transistors 806 and 808.

Having described a number of embodiments of the present invention, it should be apparent to a person skilled in the art that the apparatus and method for digital-to-analog conversion have the following advantages:

Post-conversion analog signal processing, which may include low-pass or band-pass filtering, may improve noise characteristic of the converted signal.

Pre-conversion digital signal processing, which includes the probabilistic disruption to the cyclic sequence in which unit elements are selected for activation, may reduce spurious tones (caused by unit element mismatch) of the converted signal.

The ability to adjust the disruption probability via a feedback module may allow for optimization of the noise characteristics of the converted signal.

Digital-to-analog conversion using unit elements each having a push-pull stage and a resistive element of sufficiently large resistance may have good linear characteristics.

The simplicity of the algorithm used in the sequencer with probabilistic disruption capability allows it to be implemented with low costs because of its low power and small area requirements.

Those skilled in the art will appreciate that the invention described herein is susceptible to variations and modifications other than those specifically described. For example, the apparatus for digital-to-analog conversion may include more or fewer than 8 unit elements. It is envisaged that the apparatus and method of the present invention may be suited for input signals at different sampling rates, including input signals at 2-GHz sampling rate in 65-nm implementations and predictably faster in 28-nm implementations. Variations and modifications are to be considered within the ambit of the present invention the nature of which is to be determined from the foregoing description.

It will be understood that the invention disclosed and defined in this specification extends to all alternative combinations of two or more of the individual features mentioned or evident from the text or drawings. All of these different combinations constitute various alternative aspects of the invention.

Although the description has been described with respect to particular embodiments thereof, these particular embodiments are merely illustrative, and not restrictive.

Any suitable technology for manufacturing electronic devices can be used to implement the circuits of particular embodiments, including bipolar, JFET, MOS, NMOS, PMOS, CMOS, BiCMOS, HBT, MESFET, FinFET, etc. Different semiconductor materials can be employed, such as silicon, germanium, SiGe, GaAs, InP, graphene, etc. Circuits may have single-ended or differential inputs, and single-ended or differential outputs. Terminals to circuits may function as inputs, outputs, both, or be in a high-impedance state, or they may function to receive supply power, a ground reference, a reference voltage, a reference current, or other. Although the physical processing of signals may be presented in a specific order, this order may be changed in different particular embodiments. In some particular embodiments, multiple elements, devices, or circuits shown as sequential in this specification can be operating in parallel.

Particular embodiments may be implemented in a computer-readable storage medium for use by or in connection with an instruction execution system, apparatus, system, or device. Particular embodiments can be implemented in the form of control logic in software, firmware, hardware or a combination of those. The control logic, when executed by one or more processors, may be operable to perform that which is described in particular embodiments.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

We claim:

1. A digital-to-analog converter, comprising:
    a sampler for resampling a digital signal which is quantized at a first resolution and synchronized at a first sampling rate to provide a resampled digital signal which is quantized at a second resolution lower than the first resolution and synchronized at a second sampling rate higher than the first sampling rate; and
    a DAC array for converting the resampled digital signal to an analog signal, the DAC array including an array of unit elements that are configured to:
        (i) be activated in accordance with a cyclical sequence which is probabilistically disrupted; and
        (ii) upon activation contribute substantially equally to the analog signal.

2. The digital-to-analog converter of claim 1, wherein the sampler comprises a delta-sigma modulator.

3. The digital-to-analog converter of claim 1, wherein the DAC array comprises a unit element activator for activating one or more unit elements of the array of unit elements for each sample of the resampled digital signal as received from the sampler, wherein an activation is based on the value of the respective sample.

4. The digital-to-analog converter of claim 1, wherein the DAC array includes a sequencer which is operatively coupled with the unit element activator, and configured to determine the probabilistically disrupted cyclical sequence based on a disruption probability.

5. The digital-to-analog converter of claim 4, wherein the sequencer further includes a decider module for deciding for each sample of the resampled digital signal whether or not to disrupt the cyclical sequence based on the disruption probability.

6. The digital-to-analog converter of claim 5, wherein the decider includes a random or pseudo-random number generator.

7. The digital-to-analog converter of claim 4, wherein the sequencer determines, for each sample of the resampled digital signal, which unit elements of the array will be activated based on a cyclical algorithm, and wherein, upon deciding to disrupt the cyclical sequence for a sample of the resampled digital signal, the sequencer is configured to bypass at least one unit element in the cyclical sequence.

8. The digital-to-analog converter of claim 1, wherein a unit element includes a voltage source driving a resistive element, and wherein the voltage source is configured to be switched between a first state providing a first substantially constant voltage and a second state providing a second substantially constant voltage.

9. The digital-to-analog converter of claim 8, wherein the voltage source comprises a push-pull stage.

10. The digital-to-analog converter of claim 9, wherein the push-pull stage comprises a pair of complementary transistors including an n-channel MOSFET including a first drain terminal and a p-channel MOSFET including a second drain terminal, the first drain terminal and the second drain terminal being coupled with each other and configured to drive the resistive element.

11. The digital-to-analog converter of claim 1, further comprising a filter for filtering the analog signal to produce a filtered analog signal.

12. The digital-to-analog converter of claim 11, wherein the filter includes a low-pass filter.

13. The digital-to-analog converter of claim 11, wherein the filter includes a band-pass filter.

14. The digital-to-analog converter of claim 1, further comprising a feedback module for adjusting the disruption probability based on the analog signal or a filtered analog signal.

15. The digital-to-analog converter of claim 14, wherein the feedback module is configured to adjust the disruption probability based on tones of the analog signal or the filtered analog signal, the tones being associated with imperfections of the array of unit elements.

16. A method for converting a digital signal to an analog signal, comprising:
    receiving the digital signal quantized at a first resolution and synchronized at a first sampling rate;
    resampling the received digital signal to provide a resampled digital signal quantized at a second resolution lower than the first resolution and synchronized at a second sampling rate higher than the first sampling rate;
    deciding, randomly or pseudo-randomly, if for a sample of the resampled digital signal a cyclical sequence is to be continued or disrupted;
    in response to a decision to continue the cyclical sequence, activating a first one-bit DAC unit element that is cyclically adjacent to a previously activated second one-bit DAC unit element;
    in response to a decision to disrupt the cyclical sequence, skipping a first one-bit DAC unit element that is cyclically adjacent to a previously activated second one-bit DAC unit element, and activating a third one-bit DAC unit element; and
    summing or averaging output signals of activated one-bit DAC unit elements, to contribute substantially equally to and generate the analog signal.

17. The method of claim 16, further comprising activating multiple one-bit DAC unit elements based on a value of the sample of the resampled digital signal.

18. The method of claim 17, wherein the multiple one-bit DAC unit elements are adjacent.

19. The method of claim 16, comprising:
    in response to a decision to disrupt the cyclical sequence, skipping more than one one-bit DAC unit elements that are cyclically adjacent to the previously activated second one-bit DAC unit element, and activating the third one-bit DAC unit element.

20. The method of claim 16, further comprising filtering the analog signal.

* * * * *